United States Patent [19]

Hupe et al.

[11] Patent Number: 4,990,395
[45] Date of Patent: Feb. 5, 1991

[54] ELECTRICALLY CONDUCTIVE COPPER LAYERS AND PROCESS FOR PREPARING SAME

[75] Inventors: Jurgen Hupe, Langenfeld; Frank Sonnenschein; Herbert Breidenbach, both of Solingen, all of Fed. Rep. of Germany

[73] Assignee: Blasberg Oberflachentechnik GmbH, Solingen, Fed. Rep. of Germany

[21] Appl. No.: 195,448

[22] Filed: May 16, 1988

Related U.S. Application Data

[60] Continuation of Ser. No. 22,207, Mar. 5, 1987, abandoned, which is a division of Ser. No. 806,679, Dec. 9, 1985, Pat. No. 4,750,976.

[30] Foreign Application Priority Data

Dec. 19, 1984 [DE] Fed. Rep. of Germany ....... 3446319
May 11, 1985 [DE] Fed. Rep. of Germany ....... 3517009

[51] Int. Cl.⁵ .................. B32B 15/04; B32B 15/20; C25D 5/02
[52] U.S. Cl. .................................... 428/216; 428/336; 428/472; 428/469; 204/15
[58] Field of Search ............... 428/457, 469, 472, 336, 428/216; 204/15, 38.5, 41

[56] References Cited

U.S. PATENT DOCUMENTS

| | | | |
|---|---|---|---|
| 2,844,530 | 2/1957 | Wesley et al. | 204/44.5 |
| 3,981,691 | 9/1976 | Cuneo | 428/472 |
| 4,055,707 | 10/1977 | McDonald | 428/667 |
| 4,119,761 | 10/1978 | Kuze et al. | 427/126.6 |
| 4,350,574 | 9/1982 | McDonald | 204/56.1 |
| 4,727,014 | 2/1988 | Horn et al. | 430/321 |
| 4,750,976 | 6/1988 | Hupe et al. | 204/15 |

Primary Examiner—George F. Lesmes
Assistant Examiner—Christopher Brown
Attorney, Agent, or Firm—Wegner, Cantor, Mueller & Player

[57] ABSTRACT

Electrically conductive copper layers in conductor plates and electrical components having a black metal coating which is acid-soluble and capable of being applied in an acidic medium are more easily prepared and have superior properties. In the process of preparation, such conductor plates provided with a resist and, optionally, with through-contacts, and having free copper areas a) are galvanically coated with a coating of a black metal in an acidic medium;
b) the resist is removed and then the copper areas having been exposed thereby are removed by etching;
c) the conductor plates are provided with an adhering solder mask;
d) at those parts that are not covered by the solder mask the black metal coating is removed and, if desired, the copper areas exposed thereby are provided with a well solderable metal layer.

11 Claims, 1 Drawing Sheet

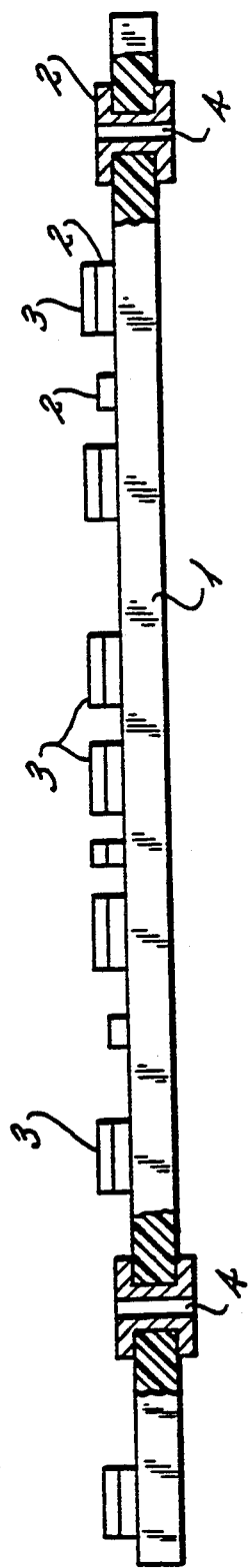

ELECTRICALLY CONDUCTIVE COPPER LAYERS AND PROCESS FOR PREPARING SAME

This application is a continuation of U.S. application Ser. No. 022,207, filed Mar. 5, 1987, now abandoned, which is a divisional of U.S. application Ser. No. 806,679, filed Dec. 9, 1985 now U.S. Pat. No. 4,750,976.

The present invention relates to electrically conductive copper layers in conductor plates and electrical components having a coating and a process for preparing same.

Processes for preparing electrically conductive copper layers in conductor plates and components are known. Thus, conductor plates are prepared in additive, semi-additive and subtractive techniques. Most conductive copper layers in high quality conductor plates having through-contacts are manufactured by the subtractive route. Herein the metal resist technique, i.e. the use of metals such as tin, lead or lead-tin alloys as protection from etching, is of great importance. However, for reasons known to the artisan today so-called copper circuits are produced to an increasing extent. A frequently preferred production method for copper circuits is the so-called metal resist strip technique. The method of making through-contacts and the effecting of build-up of the conductor image are the same as in the metal resist technique. The copper surfaces not belonging to the conductor image are coated with a resist. The resist layers may be, for example, photoresists or layers prepared by the screen printing method. In the metal resist strip technique in a first step tin, lead or a lead/tin alloy is applied onto the resist-free copper areas as anti-etch-protective. In a second step the resists are washed away, preferably by using aqueous alkali or solvents. Then the copper is removed by etching from the areas now rid of the resist. To this end ammoniacal copper chloride solutions are mostly used. Sometimes also iron chloride ($FeCl_3$) is still used. In individual cases sulfuric acid and peroxide are employed as well.

The tin, lead and lead/tin layers are stable against ammoniacal copper chloride solutions as well as against the sulfuric acid/peroxide treatment.

In the fourth step the layer consisting of tin, lead or a lead/tin alloy must be removed. This is accomplished by using, e.g., peroxide- and fluoride-containing solutions or hydrochloric acid with further additives. It is undesirable that the metallic anti-etch-protective layers (metal resist technique) remain in place, since in the soldering process a so-called orange peel will be formed by thermal stress under the solder-stopping varnish layers. This effect is due to the relatively low melting point of the metallic anti-etch-protective layer.

A substantial disadvantage of the metal resist strip technique resides in the need for removing the metal layer in an additional operational step. This is undesirable for reasons of economy of raw material and for technical reasons and in view of the costs involved. In addition, the metal stripping process also constitutes a problem; the copper is attacked as well. Furthermore, upon an incomplete removal of the protective metal layer, troubles occur in the course of applying the solder-stopping varnish. If residues remain within the bores, a subsequent clean soldered connection of the parts is not assured.

In order to ensure an improved adhesion of the solder-stopping varnish to the copper tracks, these, after the removal of the protective metal layer, are often oxidized to become black ("Schwarzoxidation"; "blackening oxidation"). In pressing together copper sheets and base material, the blackening oxidation has originally served to improve the adhesion between resin layer and copper sheet. Today the blackening oxidation is employed also because of the improved optical properties of the conductor plates.

The method of blackening oxidation is exclusively carried out in alkaline media. The treatment is effected with highly alkaline chloritecontaining solutions ($NaOH + NaClO_2$) at a temperature of 50° C. to 90° C. Although the layers obtained thereby are temperature-resistant and do not tend to show the "orange peel" as mentioned above, the mechanical stability and the thickness of these layers are not sufficiently high, so that they cannot be used as anti-etch-protective layers. Since the oxidation is carried out at relatively high temperatures, there may occur adverse effects on the base material.

Another disadvantage of the described method is that an operation in the alkaline medium is required. This is why the blackening oxidation is applicable only in the case that the alkali-soluble photoresist layer has served its purpose and has been washed away and the copper thereunderneath has been removed by etching.

After the blackening oxidation the solder-stopping varnish (soldering mask) is applied by printing. In this step the intended solder positions are left without varnish layer. More specifically, this applies to the "solder eyes" and solder holes. At the sites free of varnish the black oxide layer must again be removed. This is done using diluted hydrochloric acid or peroxide solutions. This procedure also involves some problems, as upon an incomplete removal of the oxide layer soldering defects may occur.

Then, in a final step the areas freed from oxide are selectively covered with tin or tin/lead. This measure serves to improve the solderability. In addition, the layer forms an anticorrosive layer on the copper.

Another method for preparing conductor plates in prior art copper technology comprises etching the copper layers not having covered by resist. In said method, the bores having already been provided with through-contacts (vias) and the conductive tracks are covered with a protective layer of photoresists (tenting). The drawback inherent in this method is that large amounts of copper and of etchant are consumed. In addition, a very uniform cooper plating is required in order to obtain good results. A further method comprises the so-called differential etching in combination with the semi-additive technique. Disadvantageous in differential etching is the requirement of an absolutely uniform layer thickness distribution of the galvanically deposited copper, on the surface as well as within the bores.

From the German Offenlegungsschrift (DE-OS; Published Unexamined Patent Application) 29 30 666 there have further been known conductor plates which have a copper compound stable against etchants as an anti-etch resist on the copper having been galvanically deposited. As the anti-etch resist, there is a preferred copper(II) oxide layer formed by surface transformation of the copper having been galvanically deposited; i.e. the resist is prepared by a chemical route. Herein, the conductor plates are treated with the alkaline chlorite solution as described above until from 0.5 to 5 $\mu$m of the copper layer has been converted into copper (II) oxide.

However, with such a copper (II) oxide layer it is not possible to obtain a uniform coating. More specifically, with increasing thickness of the layers the structure becomes increasingly amorphous. Moreover, the process according to the DE-OS 29 30 666 has proven to be not feasible in practice.

It is the object of the present invention to provide electrically conductive copper layers in conductor plates and components with an improved coating.

It is another object of the present invention to develop a simplified and improved process for preparing electrically conductive copper layers in conductor plates having a coating.

Accordingly, the present invention provides a black metal coating which is soluble in acids and is capable of being applied in an acidic medium. A preferred preparation process is characterized in that conductor plates provided with a resist and, optionally, with through-contacts, and having free copper areas a) are galvanically coated with a coating of a black metal in an acidic medium;
b) the resist is removed and then the copper areas having been exposed thereby are removed by etching;
c) the conductor plates are provided with an adhering solder mask;
d) at those parts that are not covered by the solder mask the black metal coating is removed and, if desired, the copper areas exposed thereby are provided with a well solderable metal layer.

The process according to the present invention employs the finished conductor plates provided with the copper layer and, if desired, with throughcontacted holes. The copper layer may, for example, have been galvanically applied. In addition, part of the copper surface is still coated with a resist. The resists may be photoresist layers or resist layers prepared by the screen printing method.

BRIEF DESCRIPTION OF THE DRAWING

FIG. 1 is a perspective view of a conductor plate.

According to the invention, it has surprisingly been determined that black metal coatings may also be used as anti-etch resist and as adhesion-improving cover layer for electrically conductive copper layers. These layers are mechanically and thermally stable. Hereto, Brugger (DE-Book, "Die galvanische Vernickelung", Eugen G. Leuze Verlag, Saulgau 1967) just teaches the contrary. Namely, in accordance therewith the black nickel layers are very brittle. Furthermore, the corrosion resistance thereof would be only limited and would only satisfy low requirements. Thus, the layers would have to be coated with a varnish or rubbed with petrolatum, oil or grease. Furthermore, the wear resistance of the black nickel depositions would be very poor, and they would also undergo decomposition at 180° C. However, according to the present invention just the contrary has been observed. The black chromium layers according to the present invention even survive 300° C. and more for short periods of time, which is absolutely sufficient for the purpose of equipping and soldering.

According to a preferred embodiment of the present invention the black metal coating is applied galvanically in an acidic medium onto the copper areas from which the resist has been removed. Preferred black metal coatings are those of black chromium and of black nickel. Other galvanically applicable black metals such as cobalt, silver or alloys of said metals may also be used. For the deposition of chromium the compounds of trivalent or hexavalent chromium may be employed likewise.

Basically any black metal coating may be considered which is capable of being chemically or galvanically applied under acidic conditions, forms a well adhering layer which is stable to alkaline etching and is completely removable again in an acidic medium, and which is optically well recognizable. The color thereof may vary from deep black to grey or brown, if a sufficient optical contrast to the base plate appears. These black metal coatings have been mostly used as black chromium or black nickel coatings for decorative purposes. Thus, it has been known from the "Handbuch der Galvanotechnik", Vol. II, Carl Hanser Verlag, Munich 1966, that black chromium coatings having good adhesion strength and good black body properties can be deposited. However, according to what has been set forth therein, said black chromium coatings are mechanically not very stable and upon a scouring stress readily become shiny and then unsuitable for said purposes. Robert Weiner ("Die galvanische Verchromung", Eugen G. Leuze Verlag, Saulgau 1974) describes the preparation of matte black chromium coatings which have very good radiation properties. Occasionally such coatings are used in optical and thermal devices and in X-ray apparatus. However, said coatings are of only moderate importance since upon mechanical stress and scouring actions, the deeply matte coatings rapidly become shiny and then lose their desired effectiveness.

In addition to the fields of application as mentioned, the black chromium plating is also used in other industrial fields of application, e.g. for measuring and controlling devices, in the electrotechnical industry, in medical apparatus construction and in the automotive industry (cf. C. Juhos, S. Gheorghe, E. Grünwald and C. Värhelyi, Galvanotechnik 75 (1984) 702).

Surprisingly, the black chromium and black nickel coatings according to the present invention are also excellently suitable for use as anti-etch resist and adhesion-improving cover layer of electrically conductive copper layers. These layers are mechanically and thermally stable up to at least 300° C. and ensure an excellent adhesion strength to the soldering masks remaining on the conductor plates. In some cases the quality of the black metal coatings is improved in that they are not directly applied onto the copper but onto a thin gloss metal layer having a thickness of from 0.5 to 3 μm. These gloss metal layers are so thin that they may also be effectively and completely removed.

The thickness of the black chromium layer usually is from 0.1 to 10 μm, and preferably from 0.5 to 4 μm. For nickel the layer thickness is from 0.1 to 2 μm, and preferably from 0.5 to 2 μm. A particularly preferred range is from 0.5 to 1.5 μm. Surprisingly, these black chromium layers are deposited with current densities of about 3 to 10 A/dm$^2$. In contrast thereto, prior art teaches to apply current densities in excess of 20 A/dm$^2$. A particular advantage of the black metal layers employed according to the present inventions is constituted by its superior mechanical and chemical resistance as compared to the known black oxide layers of copper.

A similarly good resistance is also exhibited by the matte nickel layers as used by prior art in some individual cases. It is a disadvantage of these layers that they are rather difficult to remove and are only incompletely removed if a removal is required. The solderability of nickel layers is known to involve problems.

In a following step, the photoresist layer is removed in a conventional manner using aqueous alkaline agents or organic solvents. Then the copper etching of the copper areas freed from the resist is carried out. To this end, alkaline agents such as ammoniacal copper chloride ($CuCl_2$) solutions are mostly used. Thereafter the solder-stopping varnish is applied as a soldering mask, which adheres particularly well to the black metal layer of to the invention.

In a further process step, the black metal layer is again removed from the areas not having been covered with the solder-stopping varnish (soldering mask). In this selective etching step, more specifically, the bores and solder eyes are again uncovered and exposed. This etching is carried out in an acidic medium using mineral acids or acidic peroxide solutions. If desired, in a final process step the copper areas from which the black metal has been removed are tinned or provided with an otherwise well solderable metal layer. Tinning does not cause any problems, since the anti-etch protective consisting of the black metal can be readily and completely removed. Furthermore, the anticorrosive effect of the black metal coatings according to the invention is particularly good, all the more so since the copper tracks mostly remain under the well adhering soldering mask.

The mechanical strength and adhesion of the soldering mask are superior to those of known copper oxide layers. More specifically, if the copper oxide layers are too thick, the adhesion properties of the soldering mask are unsatisfactory.

Further investigations of the process for preparing the electrically conductive layers have shown that the black metal coatings having been galvanically applied in an acidic medium may always be faultlessly removed from the portions uncovered by the soldering mask unless they have been artificially aged by the action of heat for an extended period of time. However, when solder-stopping masks are cured at a temperature of about 100° C. to 150° C., additional changes do occur in the black metal layer, which changes, particularly in the case of black chromium, result in that after etching hydrochloric acid residues will remain which, in the course of the subsequent hot air tinning, may result in defective conductor plates. These residues, formed by aging, are extremely difficult to remove. Various solutions based on acids containing various additives did not yield satisfactory results.

It has now been found that it is possible also to remove aged black metal layers without leaving a residue by alkaline potassium hexacyanoferrate(III) solutions containing wetting agent(s). These solutions must contain at least 0.2 mol/l of potassium hexacyanoferrate(III), while, however, they may be saturated as well. The potassium hydroxide content must be at least 0.1 mol/l and may be readily increased to 5 mol/l. The wetting agent content should be 0.001 to 1 g/l. As the wetting agents there may be used all agents which are basically insensitive to alkali and oxidants.

The process of the removal of the aged or non-aged black metal coatings may be carried out at temperatures of between room temperature and 70° C. Under these conditions no noxious attack to the solder-stopping masks or other parts of the conductor plates does occur. The exposed copper areas are not attacked by the solution. The soldering sites, exposed according to the invention, subsequently may be selectively tinned or tinned/leaded.

The present invention is further illustrated by the following non-limiting examples:

EXAMPLE 1

The conductor tracks and walls of the bore holes of a conductor plate having resist printed thereon were copper-plated in a commercially available copper electrolyte, e.g. CUPROSTAR LP 1 *), to make a thickness of 25 $\mu$m. After the plate had been rinsed, it was provided with a grey-black layer of about 1 $\mu$m in thickness containing nickel oxide. The deposition was effected from a commercially available black nickel electrolyte, e.g. "BLACK PEARL" **) The deposition parameters were:

| pH value: | 5.8 |
|---|---|
| Temperature: | 30 to 32° C. |
| Current density: | 0.8 to 1 A/dm$^2$ |
| Period of exposition: | about 5 minutes. |

After rinsing and drying the resist was removed under aqueous alkaline conditions, and the exposed copper areas were removed in an ammoniacal copper chloride solution. The black nickel layer provided a sufficient protection from etching.

Even better results were accomplished with a thin gloss nickel layer of about 3 $\mu$m applied between the copper layer and the black nickel layer.

EXAMPLE 2

The copper-plated conductor plates were rinsed as described in Example 1 and then treated with a commercially available black chromium bath, e.g. NEROSTAR CR *). Within about 15 minutes at current densities of about 15 A/dm$^2$, black chromium layers having a thickness of approximately 4 $\mu$m were deposited. The working temperature was about 20° C. to 25° C., and the pH was strongly acidic (about 1). *) a product of Blasberg Oberflächentechnik GmbH.

The black chromium layer, upon etching in an ammoniacal copper chloride solution, provided a sufficient protection from etching.

The conductor plates treated in accordance with Examples 1 and 2 were then printed with solder-stopping resist (soldering masks) so that the solder eyes and bores were not covered. Then in these areas the anti-etch protective layer was selectively removed. As the last step there was carried out tinning using hot air. The plates treated according to the invention passed these latter process steps also without any trouble. Thereafter, the soldering masks exhibited excellent adhesion, the underlying copper layers were matte black and optically well-contrasting against the base plates. The copper areas freed from the black metal anti-etch protective layer accepted the tin well and yielded stable unobjectionable soldered connections.

EXAMPLE 3

Conductor plates having through-hole contacts and resist printed thereon were copper-plated in a commercially available copper electrolyte (e.g. CUPROSTAR LP 1) to produce a thickness of 25 $\mu$m and subsequently coated with a black chromium layer of about 2 to 3 $\mu$m thickness (operation conditions: current density of 5 A/dm², exposure time of 20 minutes).

After resist-stripping and removing (etching), the superfluous copper area the plates were covered with a solder-stopping mask so that the solder eyes and bores remained uncovered. Curing the solder-stopping mask was effected, depending on the type thereof, at a temperature of from 100° C. to 150° C. Then the black chromium layer was selectively removed from the solder eyes and bores using a solution of 260 g/l of potassium hexacyanoferrate(III), 35 g/l of potassium hydroxide and 0.035 g/l of wetting agent (Triton BG 10). The working temperature was 40° C., and the period of exposure was 2 minutes. In contrast to the removal under acidic conditions of correspondingly aged black chromium layers, the black chromium layers were removed without leaving any residue. Thereafter, it was possible to selectively tin or lead-tin these sites.

Variations in the concentrations of potassium hexacyanoferrate(III), of potassium hydroxide and of wetting agent and eventually in the working temperature and exposition time showed that in all cases reliably good conditions were obtained.

EXAMPLE 4

Adhesion strength of black nickel after annealing.

Black nickel-plating was carried out at 3.5 V for 6 minutes. Then annealing was effected at 180° C. for 8 minutes. In the black nickel no change was observed, nor was any separation from the base material. Further annealing tests were carried out at 130° C. for 30 minutes and at 130° C. for 120 minutes. Here no change or separation, respectively, were observed either.

From these experiments it is apparent that black nickel may be employed for the purposes of the present invention. No physical change occurred during annealing.

The structure of a typical conductor plate comprising electrically conductive copper layers and the coating of black metal is further illustrated in the attached FIG. 1, wherein 1) represents the base plate;
2) represents conductive copper layers of the conductor tracks;
3) represents black metal coatings;
4) represents copper layers of the throughcontacting holes.

Not shown is the soldering mask which, specifically, leaves uncovered the portions that are still to be soldered and, if desired or present, conductor tracks and soldering spots on the reverse side of the conductor plate.

The black metal layers according to the invention may also be advantageously employed in laminating multilayers for effecting an improved adhesion between prepeg and copper sheet.

What is claimed is:

1. A conductor plate comprising an electrically conductive copper layer having two opposing surfaces, an insulator base plate on one of said surfaces, and a black metal coating that is acid-soluble and applicable in acidic medium on the other of said surfaces.

2. The conductor plate according to claim 1, wherein the black metal coating is black chromium having a thickness of at least 0.1 μm.

3. The conductor plate according to claim 2, wherein the thickness is from 0.5 to 4 μm.

4. The conductor plate according to claim 1, wherein the coating is black nickel having a thickness of at least 0.1 μm.

5. The conductor plate according to claim 4, wherein the thickness is 0.5 to 1.5 μm.

6. An electrical component comprising an electrically conductive copper layer having two opposing surfaces, an insulator base plate on one of said surfaces, and a black metal coating that is acid-soluble and applicable in acidic medium on the other of said surfaces.

7. The electrical component according to claim 6, wherein the black metal coating is black chromium having a thickness of at least 0.1 μm.

8. The electrical component according to claim 7, wherein the thickness is from 0.5 to 4 μm.

9. The electrical component according to claim 6, wherein the coating is black nickel having a thickness of at least 0.1 μm.

10. The electrical component according to claim 9, wherein the thickness of from 0.5 to 1.5 μm.

11. A process for making an etched conductor plate comprising the steps of:
    a) copper-plating an insulator base plate;
    b) applying a resist to the copper plate;
    c) galvanically coating the non-resist covered copper plate with black metal from an acidic medium;
    d) removing the resist; and
    e) etching away the copper plate exposed by removing the resist.